US008474516B2

(12) United States Patent
Valenzuela

(10) Patent No.: US 8,474,516 B2
(45) Date of Patent: Jul. 2, 2013

(54) HEAT EXCHANGER HAVING WINDING MICRO-CHANNELS

(75) Inventor: Javier A. Valenzuela, Portsmouth, NH (US)

(73) Assignee: Mikros Manufacturing, Inc., Claremont, NH (US)

( * ) Notice: Subject to any disclaimer, the term of this patent is extended or adjusted under 35 U.S.C. 154(b) by 1078 days.

(21) Appl. No.: 12/188,859

(22) Filed: Aug. 8, 2008

(65) Prior Publication Data

US 2010/0032147 A1   Feb. 11, 2010

(51) Int. Cl.
F28F 3/04   (2006.01)

(52) U.S. Cl.
USPC .......... 165/166; 165/163; 165/167; 165/80.4; 361/699

(58) Field of Classification Search
USPC ................. 165/163, 166, 167, 80.4; 361/699
See application file for complete search history.

(56) References Cited

U.S. PATENT DOCUMENTS

| | | | |
|---|---|---|---|
| 5,544,703 A * | 8/1996 | Joel et al. | 165/167 |
| 5,841,634 A * | 11/1998 | Visser | 361/699 |
| 6,213,194 B1 | 4/2001 | Chrysler et al. | |
| 6,253,835 B1 | 7/2001 | Chu et al. | |
| 6,301,109 B1 | 10/2001 | Chu et al. | |
| 6,337,794 B1 | 1/2002 | Agonafer et al. | |
| 6,536,516 B2 * | 3/2003 | Davies et al. | 165/170 |
| 6,986,382 B2 | 1/2006 | Upadhya et al. | |
| 7,032,651 B2 * | 4/2006 | Winslow et al. | 165/80.4 |
| 7,234,514 B2 * | 6/2007 | Vogel | 165/170 |
| 7,334,631 B2 * | 2/2008 | Kato et al. | 165/166 |
| 7,360,582 B2 * | 4/2008 | Olesen | 165/80.4 |

FOREIGN PATENT DOCUMENTS

| | | |
|---|---|---|
| JP | 2006-294678 A1 | 10/2006 |
| JP | 2006-351561 A1 | 12/2006 |

OTHER PUBLICATIONS

Liu, Robin H., Mark A. Stremler, Kendra V. Sharp, Michael G. Olsen, Juan G. Santiago, Ronald J. Adrian, Hassan Aref, and David J. Beebe. "Passive Mixing in a Three-Dimensional Serpentine Microchannel" Journal of Microelectromechanical Systems 9.2 (2000): 190-97.

Rosaguti, N. R., D. F. Fletcher, and B. S. Baynes. "Laminar Flow in a Periodic Serpentine Channel" Proc. of 15th Australasian Fluid Mechanics Conference, The University of Sydney, Sydney, Australia. Dec. 13-17, 2004.

(Continued)

*Primary Examiner* — Frantz Jules
*Assistant Examiner* — Alexandro Acevedo Torres

(57) ABSTRACT

A micro-channel heat exchanger suited for use in large-area cold plates includes a heat transfer member having winding micro-channels, a manifold, and a cover plate. The micro-channels' winding design is defined by a nonlinear flow axis that may include a plurality of short pitch and small amplitude undulations, which cause the flow to change directions, as well as two or more large amplitude bends that cause the flow to reverse direction. In low flow per unit area applications, the winding micro-channels allow a user to customize the pressure drop to promote good flow distribution, to achieve improved heat transfer uniformity, and to enable the pressure drop to remain above the bubble point of the heat transfer structure to prevent gas blockage. The winding micro-channels also improve the heat transfer coefficient.

26 Claims, 12 Drawing Sheets

OTHER PUBLICATIONS

Fellouah, H., C. Castelain, A. Ould El Moctar, and H. Peerhossaini, "Detection of the Onset of Dean Instability and Effects on the Rheological Behavior in Non-Newotonian Fluids" Journal of Physics: Conference Series 137. Proc. of IOPscience::.. Journal of Physics: Conference Series, vol. 137, 2008.

Martin, J., P. Oshkai, and N. Djilali. "Flow Structures in a U-Shaped Fuel Cell Flow Channel: Quantitative Visualization Using Particle Image Velocimetry." Journal of Fuel Cell Science and Technology 70th ser. 2.1 (2005): 70-80.

* cited by examiner

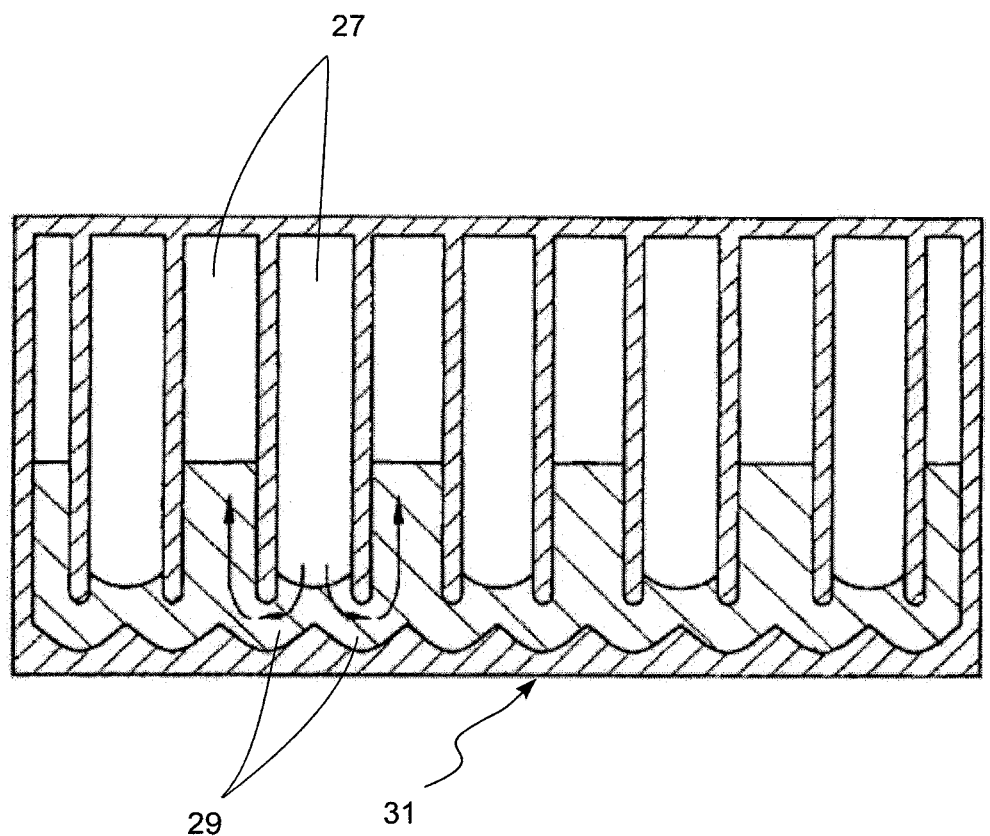
Figure 2: PRIOR ART

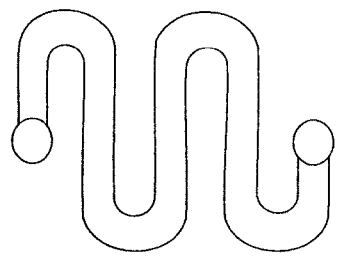
Figure 9a
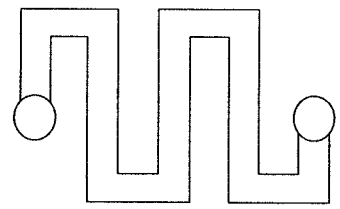
Figure 9b
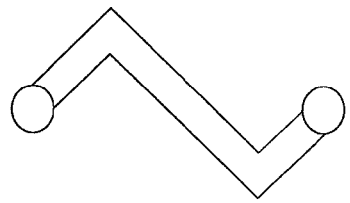
Figure 9c
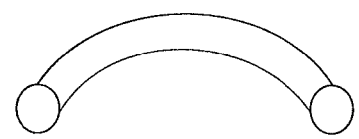
Figure 9d
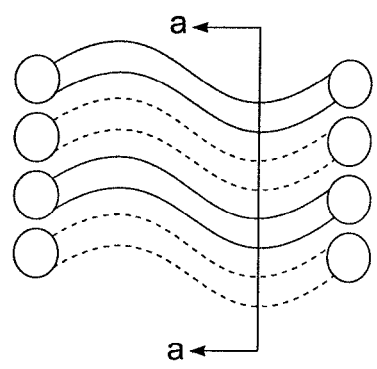 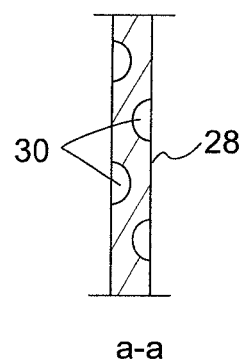
a-a
Figure 9e

HEAT EXCHANGER HAVING WINDING MICRO-CHANNELS

GOVERNMENT LICENSE RIGHT

The U.S. Government has a paid-up license in this invention and the right in limited circumstances to require the patent owner to license others on reasonable terms as provided for by the terms of Contract No. N65540-06-C-0015 awarded by the U.S. Navy.

TECHNICAL FIELD

This invention relates generally to an apparatus for cooling a heat producing device and, more specifically, to a heat exchanger having winding micro-channels for use in large-area cold plates.

BACKGROUND

The use of heat exchangers for cooling a range of electronic devices is known in the art. Liquid cooled heat exchangers are generally characterized as having macro-channels, mini-channels, or micro-channels, depending on the size of the channels. The term 'micro' is applied to devices having the smallest hydraulic diameters, generally between ten to several hundred micrometers, while 'mini' refers to diameters on the order of one to a few millimeters, and 'macro' channels are the largest in size, generally greater than a few millimeters. An example of a typical macro channel design is the conventional swaged-tube cold plate illustrated in FIG. 1a.

As shown in FIG. 1a, the prior art swaged-tube cold plate includes a copper tube 11 swaged into grooves machined in an aluminum plate 13. Swaged tubes are generally suitable for cooling large-area devices, particularly when cost is a factor, and/or when the cooling requirements do not require a very low thermal resistance. The lowest thermal resistance that can generally be achieved with a conventional swaged-tube cold plate is approximately 2° C./(W/cm$^2$). Because of these limitations, applications requiring lower thermal resistances often use finned cold plates, such as the prior art finned cold plate shown in FIG. 1b.

Conventional finned cold plates have a number closely spaced fins 21 attached to the heat transfer surface 23. The fluid flows through the channels 25 formed by the spaces between the fins. The channels typically have a width between about 1 to 5 mm. Conventional finned cold plates can achieve thermal resistances as low as approximately 1° C./(W/cm$^2$).

The thermal resistance of macro channel cold plates decreases as the flow rate is increased and approaches asymptotically a minimum value at a flow of about 0.1 LPM/cm$^2$. Increasing the flow rate further has not been found to result in an additional reduction in the thermal resistance.

For cooling high heat flux devices, such as solid-state laser diodes, which dissipate heat at a rate of 500-1000 W/cm$^2$, cold plates with substantially lower thermal resistance than that of the swaged-tube cold plates or the machined fin cold plates are needed. In these applications, micro-channel cold plates are generally employed.

There are two primary types of prior art micro-channel cold plates: parallel flow and normal flow. As the name implies, parallel flow micro channel cold plates have the liquid flowing through the heat transfer passages in a direction parallel to the surface being cooled. In contrast, normal flow micro channel cold plates (NCP) have the liquid flowing through the heat transfer passages in direction normal to the surface being cooled. The parallel flow cold plates have geometries similar to that of the finned cold plate shown in FIG. 1b, except that the dimensions are scaled down by an order of magnitude. For example, the channel width in a micro-channel cold plate is typically less than 500 microns. Because of the high pressure drop in the micro-channels, the size of the parallel flow micro-channel cold plates is typically less than about 1 to 2 cm on a side. Even at these small sizes, the pressure drop can be too large for some applications. The pressure drop can be reduced by subdividing the micro-channel into several sections and providing alternating inlet and outlet manifolds along the length of the cold plate, for example as described in U.S. Pat. No. 6,986,382 to Upadhya.

One objective in the design of micro-channel cold plates is to minimize the pressure drop consistent with achieving the target thermal performance. Minimizing the flow length and maximizing the flow area of the micro-channels is most often employed to achieve this objective. Conventionally, the flow length is minimized by making the flow axis straight, while the flow area is maximized by making the micro-channel depth large compared to its width. As such, prior art parallel-flow micro-channels have a depth that is an order of magnitude larger than the width.

Normal flow cold plates invented by the present inventor, Javier Valenzuela and as described in U.S. Pat. Nos. 5,145,001 and 6,935,411 among other patents, demonstrate excellent heat transfer effectiveness, especially in high heat-flux applications. However, for some systems the highly effective cooling provided by the normal flow design is not required, and the cost of the heat exchanger may not be warranted. FIG. 2 shows one example of a cross-section of a prior-art normal flow micro-channel cold plate. Normal-flow micro-channel cold plates incorporate a low-pressure drop manifold structure 27 that distributes and collects the flow over the active area of the cold plate. The micro-channels 29 are embedded in a thin layer between the manifold structure and the active surface 31. The micro-channels direct the fluid in a direction substantially normal to the active surface: first from the manifold structure towards the active surface, and then from the active surface towards the manifold structure. The total length of the micro-channels is very short, about twice the thickness of the heat transfer layer and, therefore, the pressure drop in the normal flow micro-channel cold plates is small, even at the high flow rates per unit area required in these high heat flux applications.

In spite of the order of magnitude lower thermal resistances that can be obtained through the use of micro-channels, they are seldom used in large-area cold plates. The principal objections to the use of micro-channels in large area cold plates are: (1) the large pressure drop associated with the flow through long, small-hydraulic-diameter passages, and (2) the relatively high cost of fabricating passages with such small dimensions.

There are also other methods of cooling that utilize fluid flowing through channels in order to cool a device. For example, U.S. Pat. No. 6,213,194 discloses the use of a hybrid cooling system for an electronic module which includes refrigeration cooled cold plate and an auxiliary air cooled heat sink. The '194 patent also discloses the use two independent fluid passages embedded in the same cold plate to provide redundancy. A single serpentine passage, akin to that of a swaged tube cold plate, or multiple straight passages feed by headers, akin to a finned cold plate is used for each one of the redundant systems.

SUMMARY

In accordance with the present disclosure, there is provided a micro-channel heat exchanger that is suited for use in large-area cold plates. The heat exchanger of the present application includes a heat transfer member having winding micro-channels, a manifold, and a cover plate.

The micro-channels' winding design is defined by a non-linear flow axis that, in one embodiment, has a plurality of short pitch and small amplitude undulations, which cause the flow to change directions, as well as two or more large amplitude bends that cause the flow to reverse direction. Gas blockage has been discovered to significantly impair performance in low flow per unit area applications. In low flow per unit area applications, the winding micro-channels allow a user to customize the pressure drop to promote good flow distribution, to achieve improved heat transfer uniformity, and to enable the pressure drop to remain above the bubble point of the heat transfer structure to prevent gas blockage. The winding micro-channels also increase the heat transfer coefficient.

The heat transfer member includes one or more heat transfer layers, each having a plurality of inlet openings and corresponding outlet openings. Each of the winding micro-channels is in fluid communication with at least one of the inlet openings and at least one of the corresponding outlet openings, such that the cooling fluid enters the inlet openings, flows along the micro-channels, and exits via the outlet openings. In one embodiment, the openings are arranged in rows through each layer, each opening extending from the first surface through to the second surface of each heat transfer layer.

The manifold supplies fluid to each of the inlet openings of the heat transfer member and receives fluid from each of the outlet openings of the heat transfer member. The manifold distributes and collects the fluid throughout the active heat transfer area in order to promote uniform heat transfer throughout the area. In one embodiment, fluid enters the heat exchanger through an inlet port that is fluidly connected to an inlet header that distributes the fluid along the y-axis of the manifold. The fluid is then fed to inlet channels that are fluidly connected to the inlet header, such that the fluid is distributed by the inlet channels along the x-axis of the manifold. A plurality of outlet channels which are interdigitated with the inlet channels collect the exit fluid along the x axis of the manifold and carry it to the outlet header which collects the fluid along the y-axis if the manifold and carries it to the outlet port.

The functions of distributing and collecting the fluid to the heat transfer surface and transferring the heat between the fluid and the surface are achieved by the two separate components in the present invention: the manifold and the heat transfer member, respectively. This separation in functions allows the selection of the flow passage geometry in each component to the benefit of their respective functions. In alternate embodiments disclosed herein the configuration of the winding micro-channels is modified according to the particular application, but in all embodiments, the micro channel axis remains non-linear.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

FIG. 2 is a cross-sectional view of a prior art normal flow heat exchanger;

FIG. 4b is a cross sectional view taken along lines 4b-4b of FIG. 4a;

FIG. 5a is a schematic view of the winding micro-channel of FIG. 3b with numerals 0-5 representing the average fluid temperature in the micro-channel segment according to the present invention; and FIG. 5b is a schematic view of a prior art linear micro-channel with numerals 0-5 representing the average fluid temperature in the micro-channel segment;

FIG. 6a is a schematic view of the winding micro-channel of FIG. 3b according to the present invention;

FIG. 6b is a schematic view a second prior art linear micro-channel configuration in which the distance between the inlet and exit openings remains the same as in the winding micro-channel configuration of FIG. 6a;

FIGS. 9a-9e are schematic views of alternate micro-channel designs according to the present invention;

DETAILED DESCRIPTION

Figure 1A:
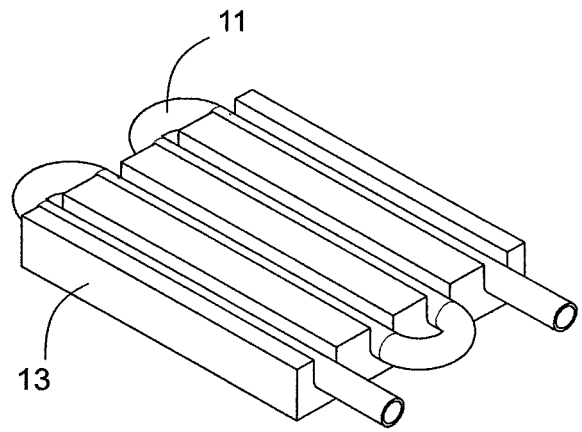
FIG. 1a is a perspective view of a prior art swaged-tube cold plate.
Figure 1B:
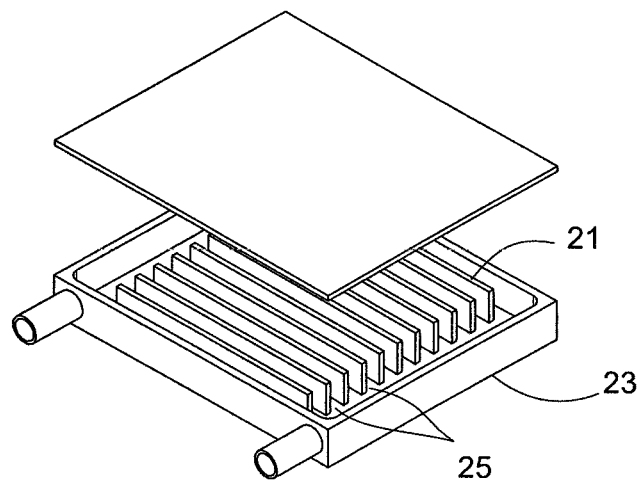
FIG. 1b is a perspective view of a prior art finned cold plate with its cover raised.

The embodiments disclosed herein relate to a heat exchanger having winding micro-channels for use in large-area cold plates. The term "large-area cold plate" as used herein refers to heat exchangers used for transferring heat between a surface and a fluid where the cold plate surface dimensions are larger than about 2×2 centimeters. Although the present application will make reference to large-area applications, the micro-channel design may find use in other applications, particularly those having extremely low flow per unit area where there is a desire to increase the pressure drop to assist in flow distribution and to avoid gas blockage. As also used herein, the term "winding" is used to mean a twisting, serpentine, sinuous path, or the like, which may have a curvature or be angular, and which creates a non-linear path between an inlet and an outlet.

Referring initially to FIGS. 3a-4b, a winding micro-channel heat exchanger 10 including a manifold 12, a heat transfer member 14 having winding micro-channels 30, and a cover plate 15, is illustrated. In use, heat is transferred to, and/or from the heat exchanger 10 over the portion of the cover plate that is enclosed by the dashed line 17, which corresponds to the portion of the heat exchanger 10 that includes winding micro-channels 30, as described in more detail below. In the heat exchanger 10 of the present embodiment, the functions of distributing and collecting the fluid over the active heat transfer area 17 and transferring the heat between the fluid and the active heat transfer area 17 are achieved by two separate components: the manifold 12 and the heat transfer member 14, respectively. This separation in functions allows the selection of the flow passage geometry in each component to the benefit of their respective functions.

Heat transfer member 14 includes one or more layers 28, each having a plurality of winding micro-channels 30 formed therein. The present description is made with respect to a single exemplary micro-channel 30. Additional channels may be identical to the exemplary micro-channel, as in the present embodiment, or may be varied. For example, the channels may be mirror images, or may have different geometries, as described in greater detail below.

In the present embodiment, a bonded stack of three layers 28 is illustrated, which may be varied according the needs of the particular application, as would be known to those of skill in the art. Each layer 28 is generally planar and includes a first surface 10a and a second surface 10b, opposite the first surface. Micro-channels 30 may be formed in the second surface, for example by etching, such that the micro-channels have a depth that is less than the thickness "t" of their corresponding layer. The micro-channels may be formed by alternate methods as would be known to those of skill in the art, and may have a depth equal to the corresponding layer in some embodiments. Unlike the prior art, parallel flow micro-channels; the winding micro-channels 30 of the present invention are characterized by having an aspect ratio close to unity (i.e., the depth of the micro-channels is comparable to the width).

Figure 3A:
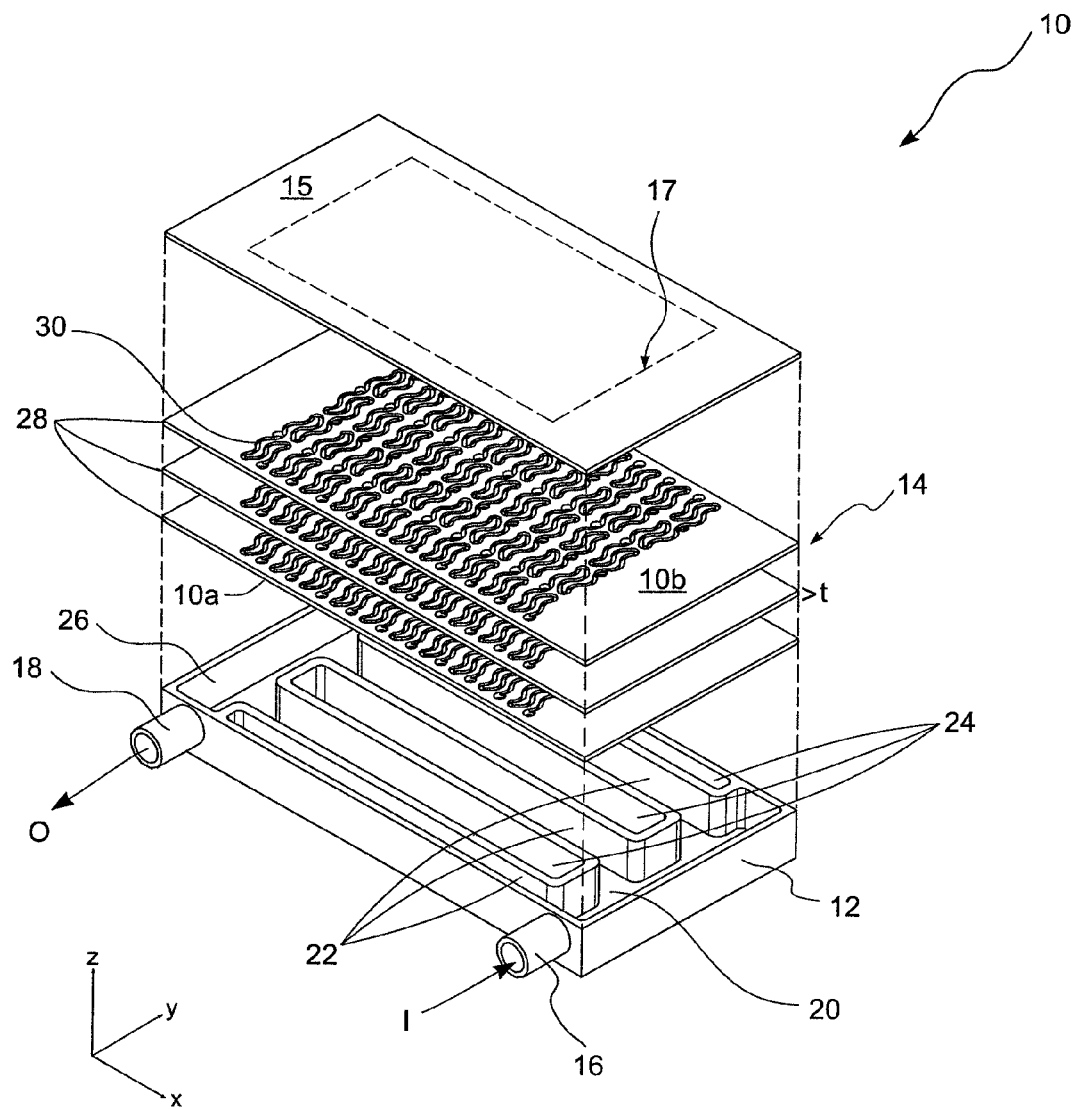
FIG. 3a is an exploded perspective view of a micro-channel heat exchanger according to a first embodiment of the present invention.
Figure 3B:
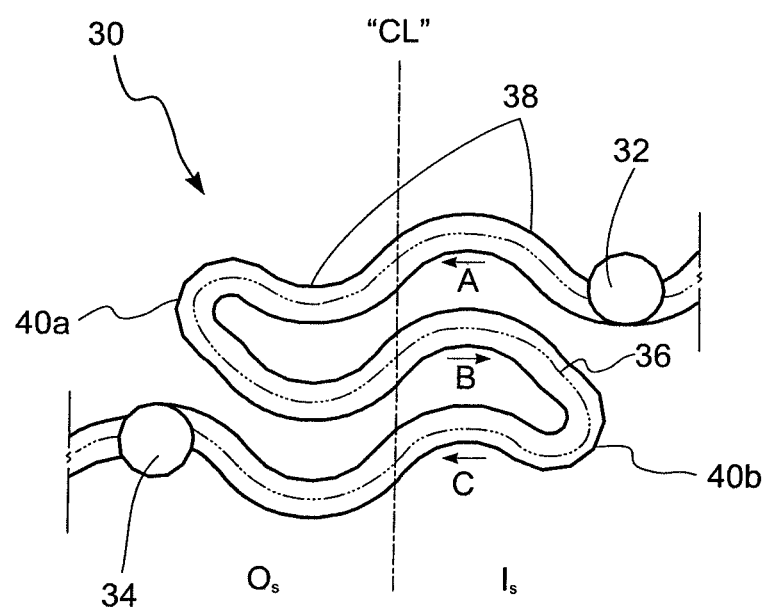
FIG. 3b is an enlarged view of a winding micro-channel of FIG. 3b.

The micro-channels 30 also each include a nonlinear flow axis 36, as best shown in FIG. 3b. The non-linear flow axis 36 may include one or more undulations 38 that cause the flow to change directions, as well as one or more pairs of bends 40a, 40b that cause the flow to reverse direction. A reference line "CL" bisects the length of the channel 30 through the approximate center between the inlet opening 32 and outlet opening 34. The portion of the channel 30 disposed between the line "CL" and the inlet opening 32 is referred to as the inlet side ($I_S$), and the portion of the channel disposed between the line "CL" and the outlet opening 34 is referred to as the outlet side ($O_S$) in the following description. It will be understood that the line "CL" is provided for reference purposes only and is not part of the heat exchanger design. The fluid flow is reversed in that the first bend 40a reverses the direction of the fluid flow from traveling from the inlet side ($I_S$) toward the outlet side as represented by arrow A, to a direction traveling from the outlet side ($O_S$) toward the inlet side of the channel as represented by arrow B. Likewise, the second bend 40b reverses the direction of the fluid that is now flowing toward the inlet side (arrow B), and re-directs the fluid flow back toward the outlet side (arrow C) of the channel. So that the flow of fluid ultimately reaches the outlet side and outlet opening 34, for each bend that changes the direction of flow toward the inlet side $I_S$ of the channel there is a corresponding bend that changes the flow back toward the outlet side ($O_S$) of the channel. In addition to the one or more pair of reversing bends 40a, 40b, the winding micro-channel 30 may also include one or more undulations 38 that change the direction of the fluid flow, but which do not reverse the direction of the fluid flow. In the present embodiment the undulations 38 have a smaller amplitude than that of the bends 40a, 40b. These smaller amplitude undulations 38 change the local direction of the fluid flow without reversing the overall direction so that the flow continues in the same overall direction the fluid was traveling before reaching the undulation. It will be appreciated that the number and size of the bends and undulations can be varied depending upon the particular application, and the micro-channels may include both bends and undulations or include just bends or just undulations.

Figure 4A:
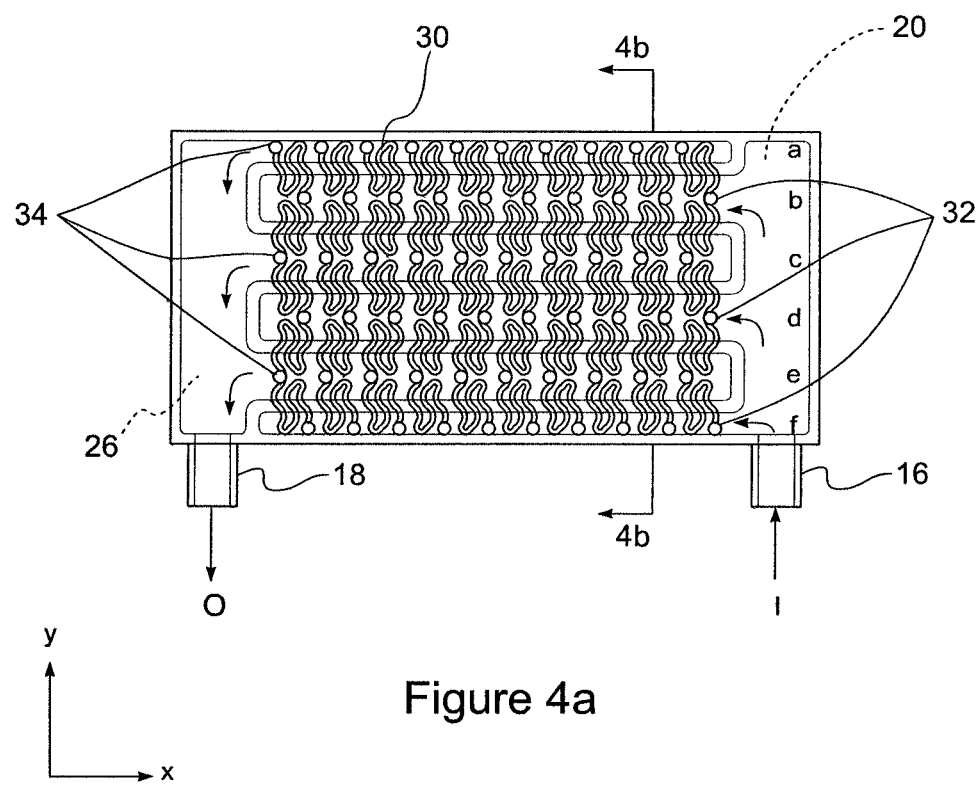
FIG. 4a is a top plan view of the heat exchanger of FIG. 3a, with its cover removed.
Figure 4B:
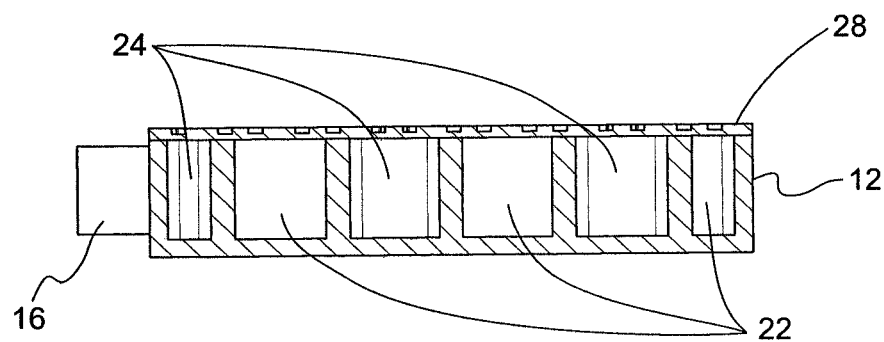

As best shown in FIG. 4a, the heat transfer layers 28 each have a plurality of inlet openings 32 and corresponding outlet openings 34 arranged in substantially parallel rows a, b, c, d, e, and f through each layer, each opening extending from the first surface 10a through to the second surface 10b. Each winding micro-channel 30 is in fluid communication with at least one of the inlet openings 32 and at least one of the corresponding outlet openings 34. Each of the inlet openings 32 and outlet openings 34, in turn, is in fluid communication with corresponding inlet channels 22 and outlet channels 24 of the manifold 12. In the present embodiment, each micro-channel 30 may share their inlet openings and/or outlet openings, although the micro-channels may alternately have independent inlet openings and outlet openings. During use, fluid is provided from the manifold 12 and flows into the inlet openings 32 and into each of the micro-channels 30. The fluid then flows through the micro-channels 30 and out of each of the outlet openings 34 which return the fluid to the manifold 12.

The manifold 12 preferably distributes and collects the fluid over the entire heat transfer surface 17 in order to promote uniform heat transfer over the surface. Fluid enters the heat exchanger 10 through inlet port 16 of the manifold which may be disposed near a first edge of the manifold 12, as best shown in FIG. 3a. Inlet port 16 is fluidly connected to the inlet header 20, such that fluid is fed from the inlet port 16 to the header 20. The header 20 distributes the inlet fluid along the y-axis of the manifold and is fluidly connected to the inlet channels 22, such that the fluid is fed from the header 20 to the inlet channels 22 which distribute the fluid along the x-axis of the manifold. The fluid is then directed to the heat transfer member 14 where it enters inlet openings 32, is directed through fluidly connected winding micro-channels 30, and exits the micro-channels through corresponding outlet openings 34. The fluid then flows into a plurality of outlet channels 24 that are interdigitated, i.e. alternating, with the inlet channels 22, along the x-axis of the manifold 12. The outlet header 26, in turn, collects the fluid exiting the outlet channels 24 along the y-axis of the manifold. Fluid exits the heat exchanger 10 through outlet port 18 that is disposed near the opposite edge of the manifold in the present embodiment.

As the fluid is being distributed and collected it is desirable to minimize the pressure drop in the manifold to promote good flow distribution. As discussed in greater detail below, it is also desirable to keep a suitably small separation between the heat transfer member inlet openings 32 and the respective outlet openings 34 to promote uniform heat transfer over the heat transfer area 17. These requirements are conflicting since a small pressure drop would favor large dimensions for the manifold channels 22 and 24, whereas a small separation between the heat transfer member inlet and outlet openings would favor small dimensions for the channels.

The distance between the inlet 32 and outlet openings 34 of the heat transfer member 14 determines the minimum length, and thereby the minimum pressure drop, of the micro-channel passages; and the distance also determines the degree of temperature uniformity (or heat transfer uniformity) which can be achieved throughout the heat transfer member. To make best use of the flow heat transport capacity, and thereby minimize the flow and pressure drop requirements for a given application, it is desirable that the fluid exit temperature be close to the temperature of surface of the heat transfer member (i.e. high heat exchanger effectiveness). The temperature difference between the fluid and the micro-channel walls is greater near the inlet openings 32 than the outlet openings 34, thereby providing greater heat transfer capability near the inlet openings than near the outlet openings. The variation in heat transfer capability is mitigated by heat conduction in the heat transfer member 14 along a plane parallel to the heat transfer surface. For high thermal conductivity materials, such as copper, this mitigation is most effective when the distance between the inlet and outlet openings is no more than a factor of 5 to 10 times larger than the thickness of the heat transfer member 14. Hence for a member 0.5 mm thick, the distance between inlet and outlet ports should be between about 2.5 to 5 mm.

While it is usually desirable in micro-channel cold plate design to minimize the pressure drop in the micro-channels by utilizing a heat transfer member having closely spaced, linear micro-channels extending between the inlet and outlet manifolds, similar to that of small-scale parallel-flow micro-channel cold plates, it was determined by the Applicant that such a design is less than optimal for large-area micro-channel cold plates. In particular, when utilizing micro-channels for a large-area cold plate having a heat transfer area of 10×10 cm it was determined that lowering the pressure drop to a fraction of a kPa resulted in the unexpected consequence that the heat transfer capability varied widely over the heat transfer surface, and some areas had hardly any cooling capacity at all, resulting in unexpected hot spots. After analyzing the results and examining the cold plate, the Applicant concluded that the unexpected consequence was due to air bubbles blocking some of the micro-channels, a phenomenon that had not been encountered in previous designs. It was determined that at the intended water flow rate, the pressure drop through the micro-channel heat transfer member was lower than the bubble point of the micro-channels, and hence insufficient to drive the bubbles out of the micro-channels, an unexpected result of the use of the linear micro-channels in the large-area application. As such, any gas present in the system could block areas of the heat exchanger, resulting in undesirable hot spots. Moreover, since good flow distribution requires that the pressure drop in the manifold be an order of magnitude smaller that in the heat transfer member, such a low pressure drop in the heat transfer member would place undue constraints on the manifold pressure drop, requiring the use of much larger manifold. Thus, contrary to expectations and to the common perception that micro-channels are not desirable because they have too large a pressure drop, Applicant determined that in their application the opposite was actually true. At the desired inlet-to-outlet channel spacing, the pressure drop of conventional micro-channels is too low at the typical flow rates employed in large-area cold plates to achieve acceptable performance.

As discussed in greater detail below, the winding micro-channel configuration disclosed herein provides a means for advantageously increasing the pressure drop in the heat transfer member to any desired value, while at the same time improving both the heat transfer capability and the heat transfer uniformity of the heat exchanger. At the flow rates per unit area typical of large area cold plates, the flow in the micro-channels is laminar (Reynolds number typically less than about 500) and the pressure drop in the micro-channels is proportional to the product of the velocity and the micro-channel length, and inversely proportional to the micro-channel hydraulic diameter. Therefore, increasing the length, increasing the velocity, or decreasing the diameter can all increase the pressure drop. The performance of micro-channel heat exchangers improves as the diameter of the micro-channels is decreased. Hence the diameter is often selected as the minimum diameter consistent with other considerations, such as ease of manufacture, or filtration level requirements. Therefore, for the purpose of comparing different micro-channel configurations, the diameter is not considered a design variable.

Figure 5:
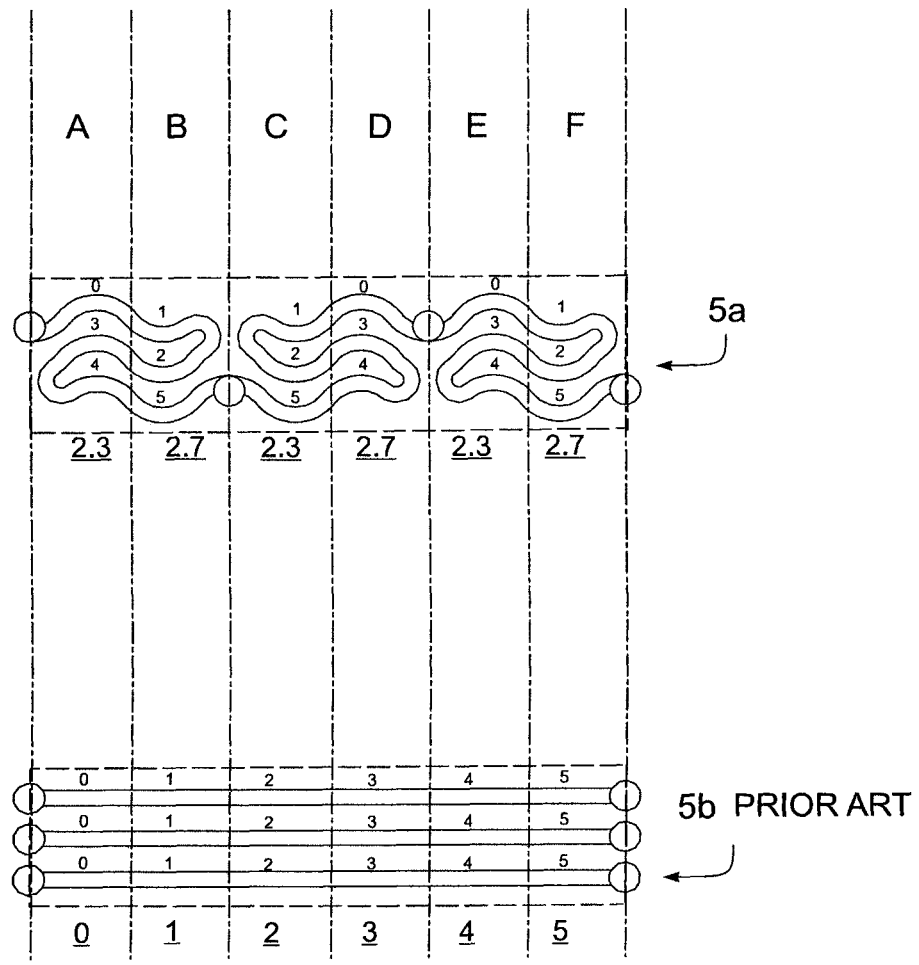
FIG. 5 is a comparison of the present winding micro-channel design with prior art linear designs where.
Figure 6:
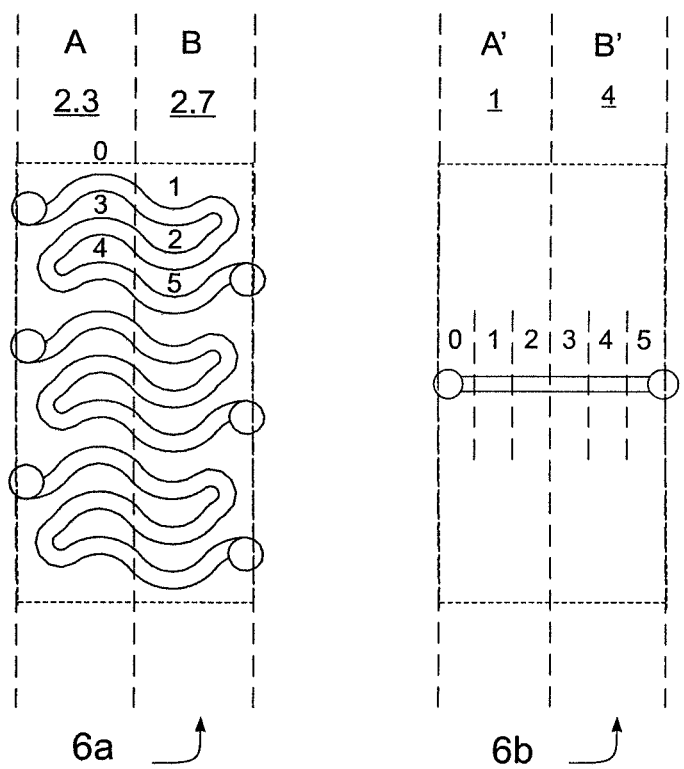
FIG. 6 is a comparison of the present winding micro-channel design with prior art linear designs where.

FIGS. 5 and 6 compare two micro-channel configurations designed to have nominally the same pressure drop when operating at the same flow per unit area of the cold plate. FIGS. 5a and 6a illustrate schematic diagrams including winding micro-channels according to the present invention. FIG. 5b illustrates a first, conventional, prior-art linear micro-channel configuration in which the desired pressure drop has been achieved by making the overall length of the linear microchannel the same as that of the winding micro-channel. Equal length is achieved by increasing the distance between the inlet and the exit openings. FIG. 6b illustrates a second conventional, linear micro-channel configuration in which the distance between the inlet and exit openings remains the same as in the winding microchannel configuration, and desired pressure drop has been achieved by increasing the flow velocity in the linear micro-channel. Increased velocity is achieved by decreasing the number of microchannels per unit area of the cold plate. As discussed below, the winding micro-channel configuration is advantageous relative to the straight (i.e. linear) micro-channel configurations on two counts: (1) improved heat transfer uniformity; and (2), greater average heat transfer capability. To illustrate the two points, the total length of each micro-channel depicted in FIGS. 5 and 6 has been divided into 6 segments of equal length. The numerals 0-5 are assigned to each segment to represent the average fluid temperature in that segment, the lowest number, "0", near the inlet opening representing the coolest temperature, and the highest number, "5", near the exit opening representing the highest temperature. The heat transfer surface in FIG. 5 if further divided by the dashed lines into six vertical columns, or strips, labeled A-F. Similarly, the heat transfer surface in FIGS. 6a and 6b is divided by the dashed lines into two vertical columns, or strips, labeled A-B and A'-B'. For each micro-channel configuration in FIGS. 5 and 6, the average fluid temperature for each strip is then computed as numerical average of the fluid temperatures within that strip. The average strip temperatures are indicated with an underscore.

For the winding configurations 5a and 6a the average fluid temperatures alternate between values of 2.3 to 2.7 between the strips. For the linear micro-channel configuration 5b with increased distance between the inlet and exit ports, the average fluid temperatures range from 0 near the inlet port to 5 near the exit port. For linear micro-channel configuration 6b with increased velocity in the micro-channels, the average fluid temperatures alternate between 1 and 4. It will be readily appreciated that the winding configuration disclosed in the present invention aids in providing greater uniformity in fluid temperature, and hence greater uniformity in heat transfer, over the heat transfer surface.

The winding micro-channel of FIGS. 5a and 6a is also advantageous over the prior art linear micro-channels because it provides a higher average heat transfer capability. The average heat transfer capability of the heat transfer member is a function of the product of the total micro-channel wall area and the micro-channel heat transfer coefficient: the higher this product, the higher the average heat transfer capability of the heat exchanger. For a conventional, linear micro-channel operating in the laminar flow regime, the heat transfer coefficient depends only on the micro-channel geometry and fluid properties, and is independent of the fluid velocity. For the winding micro-channel, in contrast, the frequent changes in flow direction result in a heat transfer coefficient larger than that of a linear micro-channel of equal cross-section, and the magnitude of the enhancement increases with increasing velocity. Hence, the average heat transfer capability of the winding micro-channel configuration 5a will be greater than that of the linear microchannel configuration 5b, even though the micro-channel wall areas are comparable. The average heat transfer capability of the winding microchannel configuration 6a will also be substantially greater than that of the linear micro-channel configuration 6b because in addition to a higher heat transfer coefficient, the winding micro-channel has a wall area about three times larger than that of the linear micro-channel. Thus, it will be readily appreciated that the winding micro-channel configuration disclosed in the present invention aids in providing greater average heat transfer capability.

The following examples are provided as comparisons, are intended to be illustrative in nature, and are not to be considered as limiting the scope of the invention.

EXAMPLE 1

Figure 7A:
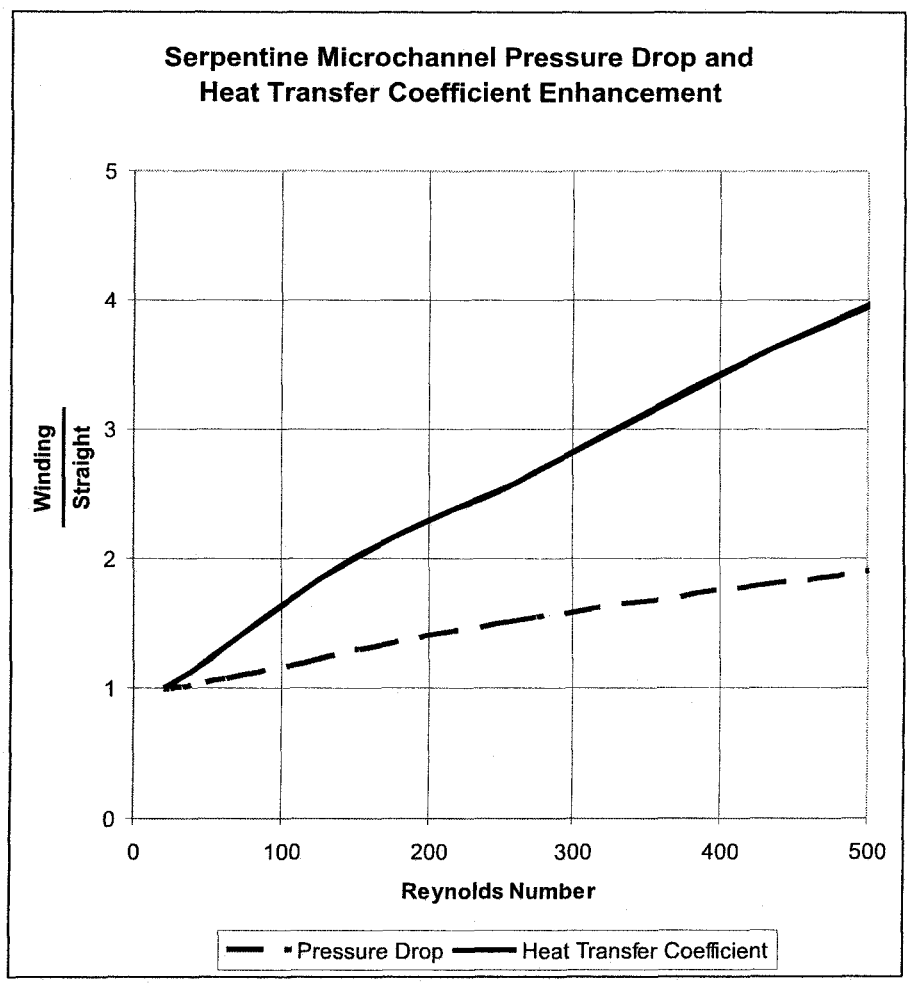
FIG. 7a is a graph showing the increased heat transfer and pressure drop resulting from the winding micro-channel geometry.

To illustrate the magnitude of the heat transfer coefficient enhancement and pressure drop increase, the ratio of the heat transfer coefficient and pressure drop of a winding micro-channel with a topology similar to that depicted in FIG. 3b to that of a straight micro-channel of equal length and cross-section were computed using ANSYS, a commercial computational fluid dynamics (CFD) software. The results of this computation are shown in FIG. 7a. At a Reynolds number of 300, the winding micro-channel heat transfer coefficient is about three times larger than that of a linear micro-channel and the pressure drop is about 1.5 times larger.

EXAMPLE 2

A heat exchanger according to the first embodiment described above was fabricated and tested. The heat exchanger had a 60×60 mm transfer area and the heat transfer member consisted of a stack of three heat transfer layers fabricated out of 0.25 mm thick copper foil. Winding micro-channels with a width of 0.25 mm and a depth of 0.17 mm were chemically etched into one surface of the heat transfer layers. Inlet and outlet opening with a diameter of 0.75 mm were etched through the heat transfer layers. The distance between the inlet and outlet openings was 4.8 mm. The winding micro-channel topology was similar to that depicted in FIG. 3b. It had six small-scale undulations with a pitch of 2.4 mm and amplitude of 0.75 mm and three large scale bends spanning the distance between the inlet and outlet openings.

Figure 7B:
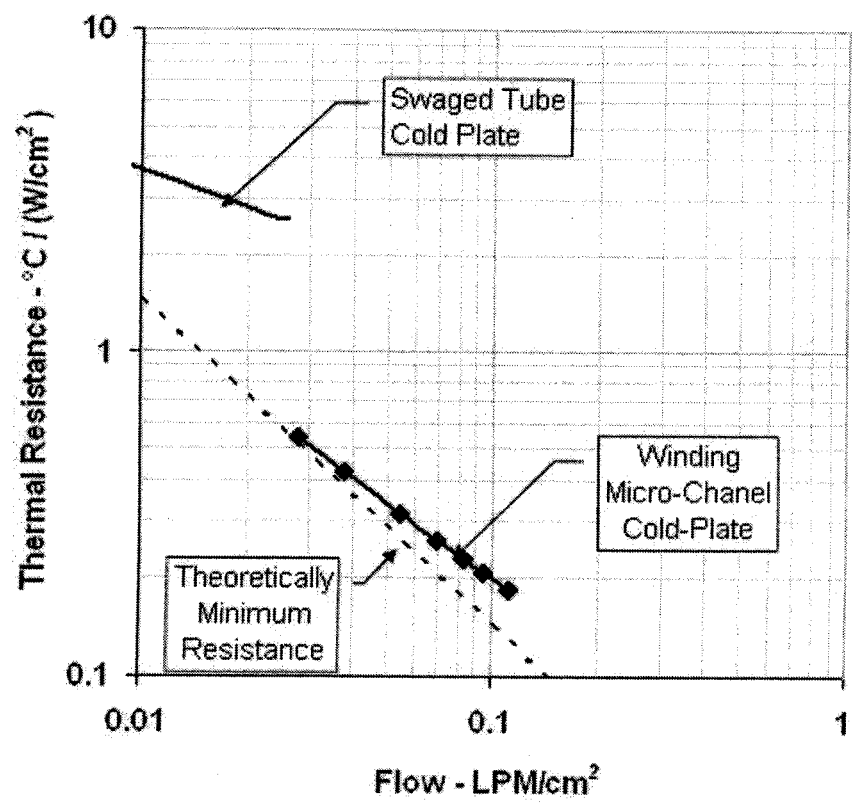
FIG. 7b is a graph showing test data comparing performance of a prior art prior art swage tube to the winding micro-channel heat exchanger of FIG. 3.

The thermal resistance of the winding micro-channel cold plate was measured as a function of the water flow rate per unit area. The measure resistance is shown in FIG. 7b. Also shown in FIG. 7b is the vendor provided performance for a swaged-tube cold plate commercially available from Lytron, Inc, product number CP15, and the theoretically minimum resistance that can be achieved at a given flow rate per unit area. The theoretically minimum resistance corresponds to that of an ideal cold plate whose surface temperature was equal to the fluid exit temperature. As evidenced from these measurements, the winding micro-channel cold plate can achieve a thermal resistance an order of magnitude lower than that of a prior art, exemplary swaged-tube cold plates. For the flow rates typical of large area cold plates, the thermal resistance of the winding micro-channel cold plate approaches the theoretical lower bound.

In addition to the potential for improved heat exchanger performance discussed above, the present disclosure provides an inexpensive approach for fabricating large area micro-channel heat exchangers to meet a wide range of applications. For example, the micro-channels 30 in the heat transfer layers 28 can be fabricated inexpensively by chemical milling. In this process, photosensitive resist layers are laminated to both sides of a metal foil and a photomask is employed to pattern the micro-channel geometry onto the resist. After development, the resist is removed from the areas that will be etched. The micro-channels may be made by etching the metal from only one side; thereby obtaining a partially etched feature that does not extend through the thickness of the layer 28. The inlet and outlet openings 32, 34 may be made by etching the metal from both sides, until all the metal is dissolved and a through feature is obtained that connects the first surface 10a to the second surface 10b.

Figure 8:
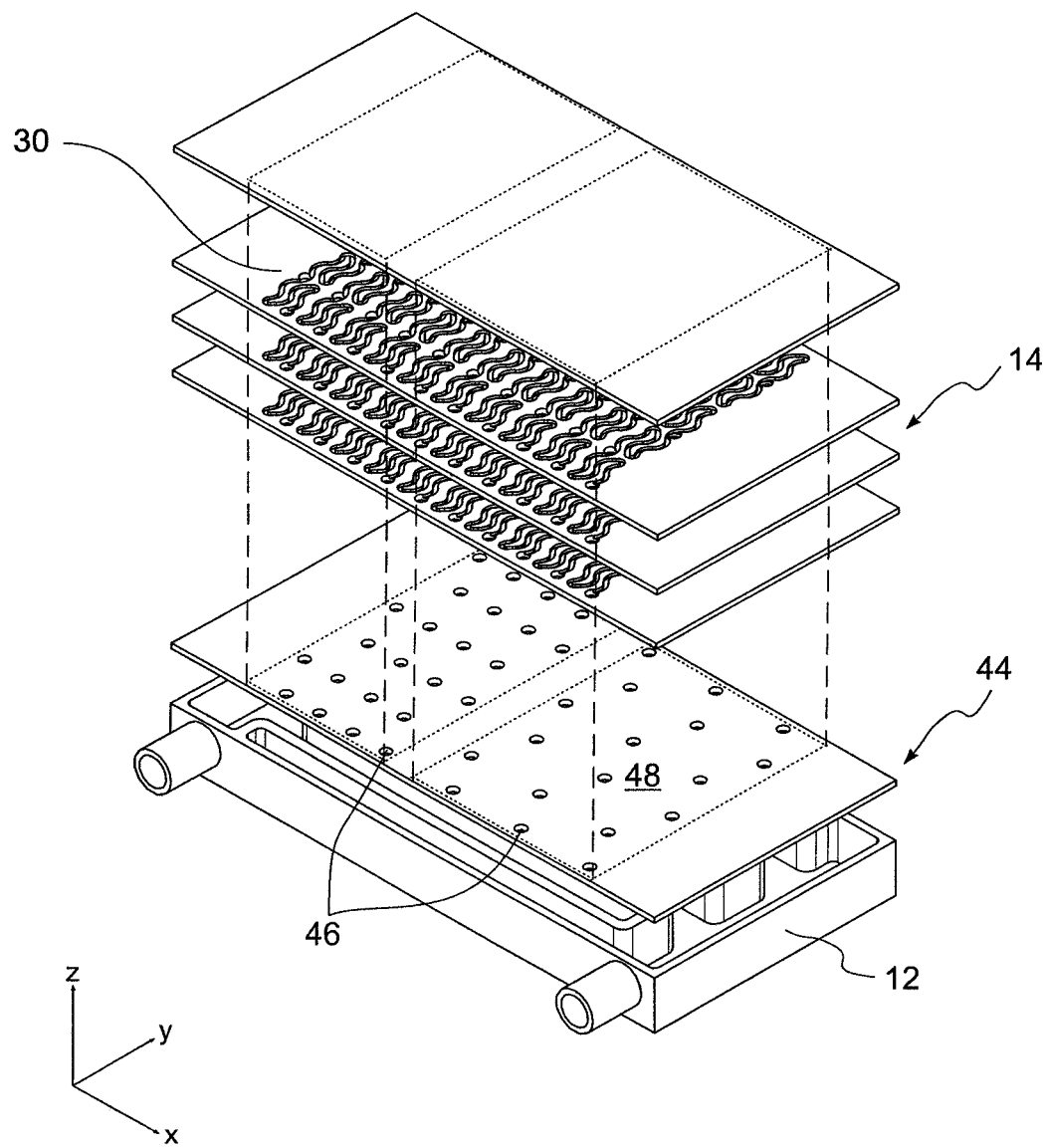
FIG. 8 is an exploded perspective view of the micro-channel heat exchanger of FIG. 3a including a flow restrictor plate.
Figure 10:
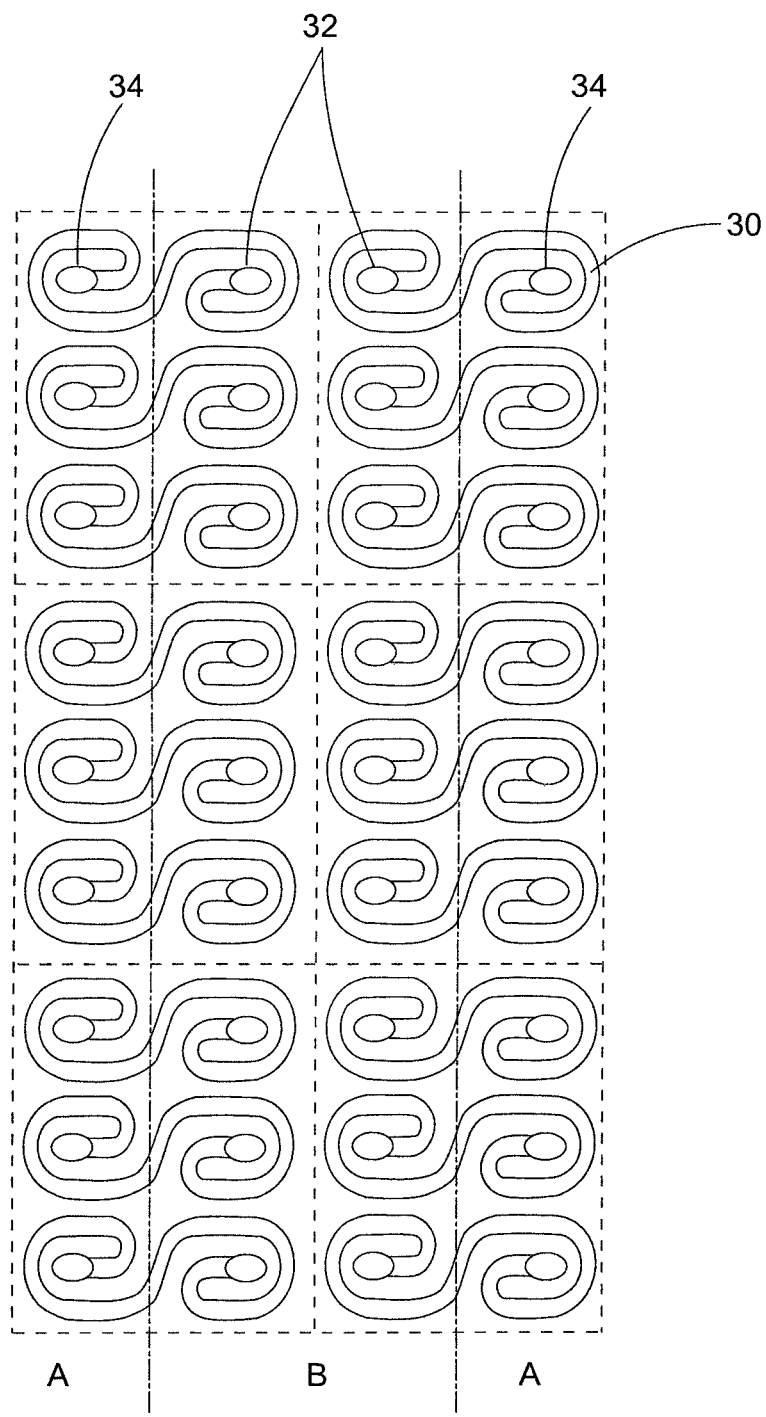
FIG. 10 is a top plan view of an alternate embodiment of a heat transfer member including winding micro-channels according to the present invention.

The present construction also simplifies the fabrication of heat exchangers having a range of heat transfer capabilities. The heat transfer capability of the heat exchanger is proportional to the flow rate, and to maintain the same thermal effectiveness, the product of the micro-channel wall area and the micro-channel heat transfer coefficient must be proportional to the flow rate. In the heat exchanger of the present disclosure, this can be easily accomplished by increasing the number of layers in the heat transfer member in proportion to the required flow for the target application. In addition, the present embodiment also allows for inexpensive tailoring of the heat transfer capability over the surface of the heat exchanger. In some applications it may be desirable to provide a greater heat transfer capability (lower thermal resistance) in one area of the heat exchanger and a smaller heat transfer capability (higher thermal resistance) in another. For example, if hot spots are disposed in one area greater heat transfer capability in that area would be desired. This can be easily accomplished by using the heat exchanger of the present disclosure. For example, a flow restrictor plate 44 can be inserted between the manifold 12 and the heat transfer member 14. As illustrated in FIG. 8, the flow restrictor plate 44 includes openings 46 that allow fluid flow through the micro-channels 30 in the areas that require maximum heat transfer capacity, while the body 48 of the plate 44 selectively blocks the flow from some of the micro-channels 30 in areas that require a smaller heat transfer capacity. The pattern, size and shape of the openings 46 can be tailored according to the particular application while the micro-channel design of the heat transfer member 14 remains the same. In this manner the same micro-channel configuration could be used for heat exchangers having different heat transfer patterns.

Yet another fabrication advantage of the heat exchanger of the present disclosure is that the flow distribution and heat transfer functions are confined to different components. The heat transfer capacity depends primarily on the geometry and material properties of the heat transfer member and high thermal conductivity materials, such as copper or aluminum, need only be used in the fabrication of the heat transfer member. The manifold could be fabricated out of lower cost materials such as a temperature resistant polymer. The manifold could also be a stamping made out of a lower cost metal. Accordingly, the present invention provides for a device that can be readily tailored to a variety of needs in an inexpensive and readily achievable manner.

It will be apparent to those skilled in the art, that there are many variations in the winding micro-channel geometry that can be used to advantage to meet the requirements of different applications. As shown in FIGS. 9a-9e and FIG. 10, various embodiments of designs for alternate micro-channels 30 are illustrated, for example, FIGS. 9b and 9c which illustrate non-arcuate embodiments; FIG. 9a that includes undulations 38 that change the direction of the fluid flow, but does not include bends that reverse the direction of the fluid flow; FIG. 9d that includes a single, arcuate undulation; FIG. 9e in which winding micro-channels 30 are etched on both sides of layer 28 to increase the micro-channel density; and FIG. 10 where each winding micro-channel 30 is separated from every other micro-channel 30. All of these designs are variations of the first embodiment and operate in the same manner.

It will be understood that various modifications may be made to the embodiments disclosed herein. For example, the dimensions and geometric shapes may be modified, as would be known to those of skill in the art. In addition, the micro-channels may find use in normal flow cold plates as well as parallel flow cold plates in which case the directional examples would be modified. In addition, the number and size of the small amplitude undulations and reverse bends can be varied depending upon the application, and some applications may only have bends that reverse the direction of the fluid flow, while others may only have undulations that change the direction of the fluid flow and some may have both. Likewise, the examples provided are not to be construed as limiting, but as projected outcomes of exemplary embodiments. Therefore, the above description should not be construed as limiting, but merely as exemplifications of preferred embodiments. Those skilled in the art will envision other modifications within the scope, spirit and intent of the invention.

What is claimed is:

1. A micro-channel heat exchanger comprising:
    a heat transfer member including at least one stackable heat transfer layer constructed and arranged to be stacked so as to tailor the heat transfer capability of the micro-channel heat exchanger, each at least one stackable heat transfer layer having a first surface and a second surface;
    a plurality of winding micro-channels disposed in each of the at least one stackable heat transfer layer and having a non-linear flow axis, the plurality of winding micro-channels each further having a diameter of no more than five hundred micrometers, the plurality of micro-channels together defining an active area of the heat transfer member;
    a manifold including an inlet port and an outlet port, the manifold being further constructed and arranged to distribute fluid and to collect fluid throughout the active area of the heat transfer member;
    a plurality of inlet openings disposed throughout the active area of the at least one stackable heat transfer layer and extending through the at least one stackable heat transfer layer from the first surface to the second surface and in fluid communication with the manifold, each of the plurality of inlet openings also being fluidly connected to at least one of the plurality of winding micro channels
    a plurality of outlet openings disposed throughout the active area of the at least one stackable heat transfer layer and extending through the at least one stackable heat transfer layer from the first surface to the second surface and in fluid communication with the manifold, each of the plurality of outlet openings also being fluidly connected to at least one of the plurality of winding micro-channels;
    wherein each of the plurality of winding micro-channels is disposed in fluid communication with at least one of the plurality of inlet openings and at least one of the plurality of outlet openings such that the non-linear flow axis of each of the plurality of winding micro-channels defines a non-linear path between the corresponding inlet opening and the corresponding outlet opening and wherein fluid flows from the manifold, through the corresponding inlet opening, into at least one of the plurality of winding micro-channels and travels along the non-linear path to the corresponding outlet opening, the non linear path increasing the pressure drop within the micro-channel as the fluid travels along the non-linear path to displace air bubbles that may be present and blocking the one or more of the plurality of winding micro-channels.

2. The heat exchanger of claim 1, wherein each outlet opening is in fluid communication with at least two of the plurality of micro-channels.

3. The heat exchanger of claim 2, wherein each inlet opening is in fluid communication with a single micro-channel.

4. The heat exchanger of claim 2, wherein each inlet opening is in fluid communication with at least two of the plurality of micro-channels.

5. The heat exchanger of claim 1, wherein the non-linear flow path includes an inlet side adjacent the corresponding inlet opening and an outlet side adjacent the corresponding outlet opening, the non linear path further including at least one pair of bends, each pair having:
    a. a first bend constructed and arranged to reverse the direction of the flow of the fluid as it travels between the corresponding inlet opening and the corresponding outlet opening such that the fluid flows toward the inlet side after passing through the first bend; and
    b. a second bend constructed and arranged to reverse the direction of the flow of the fluid as it travels between the corresponding first opening and the corresponding second opening such that the fluid flows toward the outlet side after passing through the second bend.

6. The heat exchanger of claim 5, wherein reversing the direction of the fluid flow toward the inlet side and back toward the outlet side of the non-linear path results in substantially uniform heat transfer throughout the active area of the heat transfer member.

7. The heat exchanger of claim 5, further comprising at least one undulation constructed and arranged to change the direction of the flow of the fluid as it travels along the non-linear flow path, without reversing the direction of the flow of the fluid, wherein if the fluid was moving toward the outlet side before passing through the at least one undulation, the fluid continues to move toward the outlet side after passing through the at least one undulation and wherein if the fluid was moving toward the inlet side before passing through the at least one undulation, the fluid continues to move toward the inlet side after passing through the at least one undulation.

8. The heat exchanger of claim 7, wherein the first bend, second bend and the at least one undulation each have an arcuate shape.

9. The heat exchanger of claim 1, wherein the at least one stackable heat transfer layer comprises a bonded stack of at least two laminations, each lamination including a plurality of winding micro-channels.

10. The heat exchanger of claim 1, wherein the manifold includes:
    an inlet header fluidly connected to the inlet port, the inlet header constructed and arranged to distribute the fluid along a y-axis of the manifold;
    a plurality of inlet channels fluidly connected to the inlet header and constructed and arranged to distribute the fluid along an x-axis of the manifold;

an outlet header fluidly connected to the outlet port, the outlet header constructed and arranged to collect fluid along the y-axis of the manifold; and a plurality of outlet channels fluidly connected to the outlet header and interdigitated with the inlet channels, the plurality of outlet channels constructed and arranged to collect fluid along the x-axis of the manifold and distribute it to the outlet header.

11. The heat exchanger of claim 1, wherein the at least one stackable heat transfer layer includes a thickness extending between the first surface and the second surface, the plurality of micro-channels having a depth less than the thickness of the stackable heat transfer layer in which the plurality of micro-channels are disposed.

12. The heat exchanger of claim 11, wherein the depth of the micro-channels is substantially equal to the width of the micro-channels.

13. The heat exchanger of claim 1, further comprising a flow restrictor plate disposed between the manifold and the heat transfer member, the flow restrictor plate including a body having a plurality of openings disposed there through that are configured and dimensioned to selectively direct fluid flow to the winding micro-channels in sections of the active area that require maximum heat transfer capability, the body of the flow restrictor plate being constructed and arranged to selectively block the flow to the winding micro-channels in sections of the active area that require a smaller heat transfer capability.

14. A micro-channel heat exchanger comprising:

a heat transfer member including at least one stackable heat transfer layer constructed and arranged to be stacked so as to tailor the heat transfer capability of the micro-channel heat exchanger, each of the at least one stackable heat transfer layer having a first surface and a second surface and including a thickness extending between the first surface and the second surface;

a plurality of winding micro-channels disposed in each of the at least one stackable heat transfer layer, the plurality of winding micro-channels each having a diameter of no more than five hundred micrometers, and having a non-linear flow axis, the plurality of micro-channels together defining an active area of the heat transfer member;

a manifold including an inlet port and an outlet port constructed and arranged to distribute a fluid and collect the fluid throughout the active area of the heat transfer member;

a plurality of inlet openings disposed throughout the active area of the at least one stackable heat transfer layer and extending through the at least one stackable heat transfer layer from the first surface to the second surface and in communication with the manifold;

a plurality of outlet openings disposed throughout the active area of the at least one stackable heat transfer layer and extending through the at least one stackable heat transfer layer from the first surface to the second surface and in fluid communication with the manifold;

wherein the non-linear flow axis defines a non-linear path between one of the plurality of inlet openings and one of the plurality of outlet openings, the non-linear flow path having an inlet side adjacent the corresponding inlet opening and an outlet side adjacent the corresponding outlet opening, the non-linear path further including at least one pair of bends, each pair having:

a) a first bend constructed and arranged to reverse the direction of the flow of the fluid as it travels between the corresponding inlet opening and the corresponding outlet opening such that the fluid flows toward the inlet side after passing through the first bend; and b) a second bend constructed and arranged to reverse the direction of the flow of the fluid as it travels between the corresponding first opening and the corresponding second opening such that the fluid flows toward the outlet side after passing through the second bend; and wherein during use the fluid is distributed from the manifold, through the corresponding inlet opening, into at least one of the plurality of winding micro-channels and flows into the first bend which reverses the direction of the fluid flow toward the inlet side of the micro-channel, the fluid then flowing into the second bend which reverses the direction of the fluid flow toward the outlet side of the micro-channel, and traveling along the non-linear path to the outlet opening, the flow of the fluid reversing directions at least twice along the non-linear path.

15. The heat exchanger of claim 14, wherein the plurality of micro-channels together define an active area of the heat transfer member and wherein the manifold is constructed and arranged to distribute the fluid and to collect the fluid throughout the active area of the heat transfer member.

16. The heat exchanger of claim 15, wherein reversing the direction of the fluid flow toward the inlet side and back toward the outlet side of the non-linear path results in substantially uniform heat transfer capability.

17. The heat exchanger of claim 14, further comprising at least one undulation constructed and arranged to change the direction of the flow of the fluid as it travels along the non-linear flow path, without reversing the direction of the flow of the fluid, wherein if the fluid is moving toward the outlet side before passing through the at least one undulation, the fluid continues to move toward the outlet side after passing through the at least one undulation and wherein if the fluid is moving toward the inlet side before passing through the at least one undulation, the fluid continues to move toward the inlet side after passing through the at least one undulation.

18. The heat exchanger of claim 17, wherein the first bend, second bend and the at least one undulation each have an arcuate shape.

19. The heat exchanger of claim 14, wherein the depth of the micro-channels is substantially equal to the width of the micro-channels.

20. The heat exchanger of claim 14, wherein the at least one stackable heat transfer layer comprises a bonded stack of at least two laminations each lamination including a plurality of winding micro-channels.

21. The heat exchanger of claim 17, wherein the plurality of micro-channels together define an active area of the heat transfer member and wherein the manifold is constructed and arranged to distribute the fluid and to collect the fluid throughout the active area of the heat transfer member.

22. The heat exchanger of claim 15, further comprising a flow restrictor plate disposed between the manifold and the heat transfer member, the flow restrictor plate including a body having a plurality of openings disposed there through that are configured, dimensioned and positioned to vary the flow to the winding micro-channels according to the heat transfer requirements throughout the active area.

23. The heat exchanger of claim 22, wherein the body of the flow restrictor plate is constructed and arranged to selectively block the fluid flow to the winding micro-channels in sections of the active area.

24. The heat exchanger of claim 14, wherein the manifold includes:
- an inlet header fluidly connected to the inlet port, the inlet header constructed and arranged to distribute the fluid along a y-axis of the manifold;
- a plurality of inlet channels fluidly connected to the inlet header and constructed and arranged to distribute the fluid along an x-axis of the manifold;
- an outlet header fluidly connected to the outlet port, the outlet header constructed and arranged to collect fluid along the y-axis of the manifold; and
- a plurality of outlet channels fluidly connected to the outlet header and interdigitated with the inlet channels, the plurality of outlet channels constructed and arranged to collect fluid along the x-axis of the manifold and distribute it to the outlet header.

25. A method of cooling a heat source with a heat exchanger including a heat transfer member having a plurality of winding micro-channels, the method comprising the steps of:
- providing a manifold to distribute a fluid to the heat transfer member;
- directing the fluid through an inlet port of the manifold;
- directing the fluid from the inlet port to a plurality of inlet channels;
- distributing the fluid onto a surface of at least one stackable heat transfer layer of the heat transfer member;
- directing the fluid through a plurality of inlet openings disposed throughout an active area of the at least one stackable heat transfer layer and extending through the at least one stackable heat transfer layer from a first surface to a second surface;
- providing each of the plurality of winding micro-channels with a diameter of no more than five hundred micrometers and a non-linear flow axis that defines a non-linear path between the plurality of inlet openings and a plurality of outlet openings, the non-linear flow path having an inlet side adjacent the inlet openings and an outlet side adjacent the outlet openings;
- directing the fluid toward the outlet side of the non-linear path;
- reversing the direction of the fluid flow a first time so that the fluid flow is directed toward the inlet side of the non-linear path;
- reversing the direction of the fluid flow a second time so that the fluid flow is directed back towards the outlet side of the non-linear path;
- directing the fluid through the plurality of outlet openings disposed throughout the active area of the at least one stackable heat transfer layer and extending through the at least one stackable heat transfer layer from a first surface to a second surface and into a plurality of outlet channels disposed in the manifold, the outlet channels being interdigitated with the inlet channels;
- directing the fluid through the plurality of outlet channels into an outlet port of the manifold; and
- wherein reversing the direction of the fluid flow toward the inlet side and back toward the outlet side of the non-linear path results in substantially uniform heat transfer capability throughout the active area of the heat transfer member.

26. The method of claim 25, wherein reversing the direction of the fluid flow toward the inlet side and back toward the outlet side of the non-linear path increases the pressure drop of the fluid along the non-linear path in order to displace air bubbles that may be present along the non-linear path.

* * * * *